United States Patent [19]

Heid

[11] Patent Number: 5,614,827
[45] Date of Patent: Mar. 25, 1997

[54] METHOD AND APPARATUS FOR SHIMMING A MAGNET SYSTEM OF A NUCLEAR MAGNETIC RESONANCE TOMOGRAPHY SYSTEM

[75] Inventor: Oliver Heid, Bern, Switzerland

[73] Assignee: Siemens Aktiengesellschaft, Munich, Germany

[21] Appl. No.: 622,871

[22] Filed: Mar. 29, 1996

[30] Foreign Application Priority Data

Mar. 30, 1995 [DE] Germany .................. 195 11 791.3

[51] Int. Cl.⁶ ..................................... G01V 3/00
[52] U.S. Cl. ................................ 324/320; 324/319
[58] Field of Search ............................... 324/320, 319, 324/318, 322, 307, 309; 128/653.5

[56] References Cited

U.S. PATENT DOCUMENTS

| | | | |
|---|---|---|---|
| 3,569,823 | 3/1971 | Golay et al. | 324/319 |
| 4,825,159 | 4/1989 | Oppelt et al. | 324/309 |
| 5,168,232 | 12/1992 | Glover et al. | 324/320 |
| 5,235,284 | 8/1993 | Tahara et al. | 324/320 |
| 5,343,151 | 8/1994 | Cory et al. | 324/320 |
| 5,345,178 | 9/1994 | Manabe et al. | 324/320 |
| 5,359,289 | 10/1994 | Van der Meulen | 324/320 |
| 5,391,990 | 2/1995 | Schmitt et al. | 324/320 |
| 5,539,316 | 7/1996 | Sukumar | 324/320 |

OTHER PUBLICATIONS

"Rapid Fully Automated, Arbitrary Volume, In Vivo Shimming," Webb et al., SMRM Abstracts 1990, p. 541.
"NMR Imaging Techniques and Applications: A Review," Bottomley, Rev. Sci. Instrum., vol. 53, No. 9, Sep. 1982, pp. 1319–1337.

*Primary Examiner*—Louis M. Arana
*Attorney, Agent, or Firm*—Hill, Steadman & Simpson

[57] ABSTRACT

In a method and apparatus for shimming a magnet system of a nuclear magnetic resonance tomography system, an apparatus-specific matrix is determined, which indicates the effect on the magnetic field for each shim channel. A phase difference matrix is subsequently formed by means of calculation of the phase differences between three-dimensional spatially resolved nuclear magnetic resonance raw data sets obtained with different echo times. This phase of difference matrix gives the field deviation for each pixel. In this phase difference matrix, the phase differences between consecutive pixels are calculated in several spatial directions, thereby determining a phase error data set. Finally, on the basis of the predefined matrix and of this phase error data set, currents for the individual shim channels are determined.

18 Claims, 4 Drawing Sheets

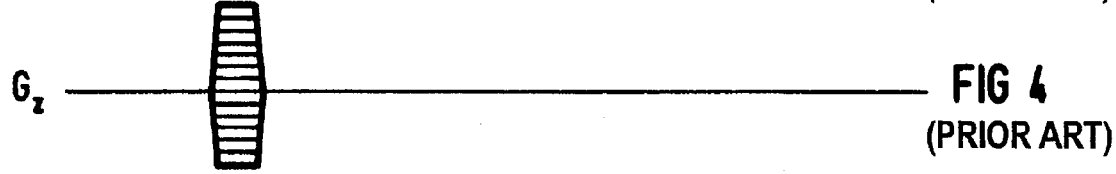
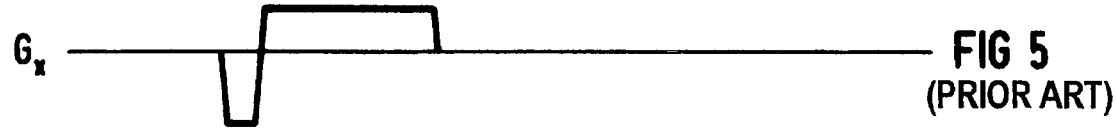
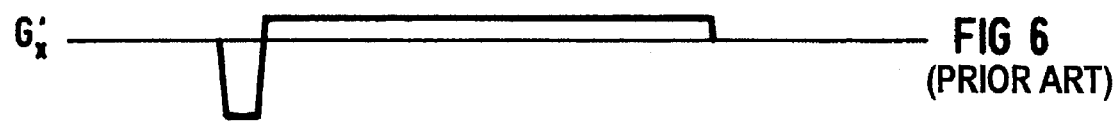
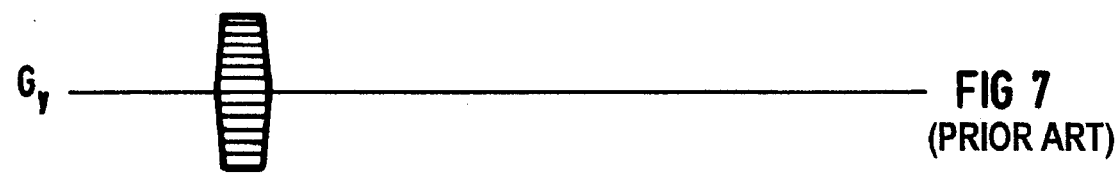
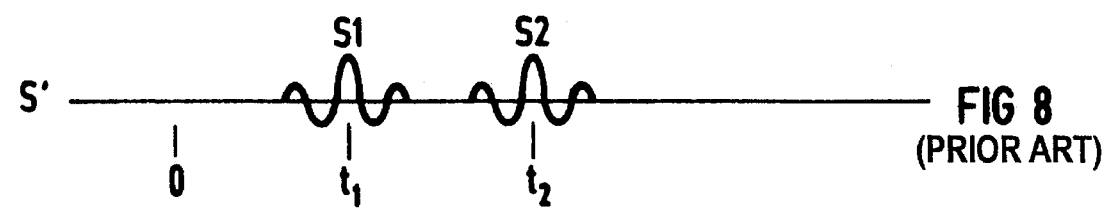
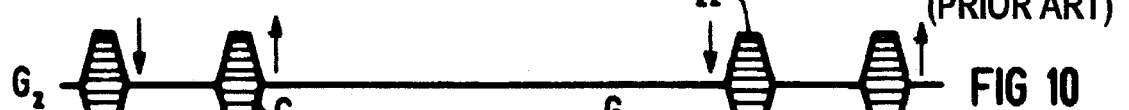
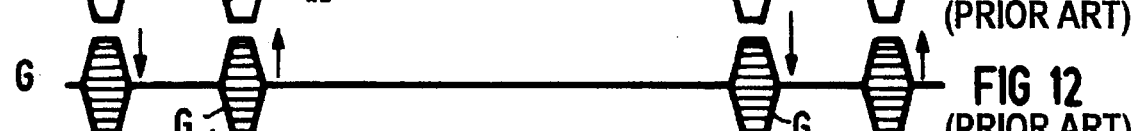

METHOD AND APPARATUS FOR SHIMMING A MAGNET SYSTEM OF A NUCLEAR MAGNETIC RESONANCE TOMOGRAPHY SYSTEM

BACKGROUND OF THE INVENTION

Field of the Invention

The present invention is directed to a method for shimming (i.e., reducing inhomogeneities in) the static magnetic field in a nuclear magnetic tomography system, as well as to an apparatus for achieving such shimming.

Description of the Prior Art

In nuclear magnetic resonance devices, the homogeneity of the basic magnetic field is a decisive factor for the imaging quality. During imaging, inhomogeneities in the field in the image area cause geometrical distortions of the field that are proportional to the field deviations. Field homogeneity is particularly important in echoplanar processes. Furthermore, for NMR spectroscopy extremely high demands are made on field homogeneity in order to achieve a sufficient resolution of the spectral lines. Field Inhomogeneities lead to overlapping of the spectral lines.

In order to achieve the required homogeneity levels, a so-called passive shimming is first carried out, i.e. iron plates (for example) that improve the homogeneity are attached in the magnet. An arrangement of this sort is known e.g. from U.S. Pat. No. 5,235,284. This passive shimming, however, is insufficient at high precision levels. For this purpose, special shim coils are additionally provided, charged with an adjustable current. Linear field deviations, i.e., first-order field errors, can also be compensated by supplying gradient coils with an adjustable offset current, i.e. a constant current on which is superimposed a gradient pulse sequence. This is known e.g., from U.S. Pat. No. 5,345,178.

Adjustment of the currents for the shim coils and adjustment of the offset currents for the gradient coils has to be carried out under high-precision conditions while the subject being examined is located in the magnetic field, since under some circumstances the presence of the subject influences the distribution of the magnetic field. A precondition for the adjustment of the shim currents is first of all the precise knowledge of the existing field distribution.

In P. Webb and A. Macovski, "Rapid, fully automated, arbitrary volume, in vivo shimming," SMRM Abstracts 1990, p. 541, a method is disclosed in which two 3-D gradient echo sequences with different echo times are first carried out. On the basis of these two sequences, phase images are generated and then are subtracted. The magnetic field distribution can be three-dimensionally acquired, and M data points can be obtained that are represented in the form of a vector x. Furthermore, a "reference map" is formed in which the influence of M shim coils on the magnetic field is represented in the form of a matrix A. The shim currents to be determined are represented in the form of a vector C. The required shim currents are finally calculated by minimizing the quadratic deviation of the quantity A·C−x.

From U.S. Pat. No. 5,345,178, a shim method is known in which, for the purpose of calculating the magnetic field inhomogeneity, a gradient echo sequence or a spin echo sequence with non-central 180-degree high-frequency pulses is first generated. The nuclear magnetic resonance signal thus obtained is Fourier-transformed and the phase curve of the nuclear spins in a predefined region is calculated. This is iterated for different projections. The thus-obtained phase curves are analyzed using a curve fit method, and the coefficients of the spherical harmonic functions that describe the field distribution are determined therefrom. The current to be fed to the individual shim coils is thereby determined.

In this type of determination of the field distribution, however, the following problem arises. In the examination of biological tissue with the usual proton imaging, signal portions from the protons bound in fat appear alongside the dominant signal portions from water molecules. These protons have a resonant frequency that is easy to distinguish in comparison with the water protons, due to their different chemical bond. In a magnetic field of strength 1.5 T, the frequency deviation between fat protons and water protons, for example, is around 110 Hz. If one now wished to distinguish reliably the frequency shift caused by the frequency difference in the fat and water signals from the frequency shift caused by magnetic field inhomogeneities, it would already be the case, before even beginning the active shim procedure, that the frequency shift caused by the inhomogeneities could not be greater than 110 Hz over the entire volume under consideration. This is, however, an extreme demand that can hardly be met in practice.

SUMMARY OF THE INVENTION

An object of the present invention is to provide a method and an apparatus of the above type wherein improved shimming is possible, taking into consideration the above-described problem.

The above object is achieved in accordance with the principles of the present invention in a method and apparatus for shimming a magnet system of a nuclear magnetic resonance tomography apparatus having at least one shim channel, wherein a predefined matrix is determined which indicates, for each shim channel, the effect of a unit current on each pixel of a phase error data set. The phase error data set is obtained by producing two three-dimensional spatially resolved nuclear magnetic resonance raw data sets in the form of two three-dimensional raw data matrices, the phases of the respective data in the two raw data sets depending differently on magnetic field inhomogeneities, three-dimensionally Fourier transforming the raw data matrices, determining phase differences between corresponding pixels of the Fourier transformed raw data sets and forming a three-dimensional phase-difference matrix incorporating these phase differences, determining the phase differences between consecutive pixels of the phase difference matrix in at least one spatial direction and forming one phase error data set per spatial direction. The current for each shim channel is then determined on the basis of the phase error data sets and the predefined matrix, and the shim currents determined in this manner are then supplied to the respective shim channels.

DESCRIPTION OF THE DRAWINGS

FIGS. 3 to 8 illustrate a first exemplary embodiment for a known pulse sequence for determining the existing magnetic field distribution.

FIGS. 9 to 13 illustrate a second exemplary embodiment for a known pulse sequence for determining the existing magnetic field distribution.

DESCRIPTION OF THE PREFERRED EMBODIMENTS

As is generally known, a spatial resolution of the nuclear magnetic resonance signals in nuclear magnetic resonance tomography ensues by means of the superimposition of a linear magnetic field gradient on a homogeneous, static basic field on the order of 1 T. The principles of imaging are explained e.g. in Bottomley, "NMR imaging techniques and applications: A review" in: Review of Scientific Instrumentation, 53 (9), 9/82, pp. 1319–1337.

Figure 1:
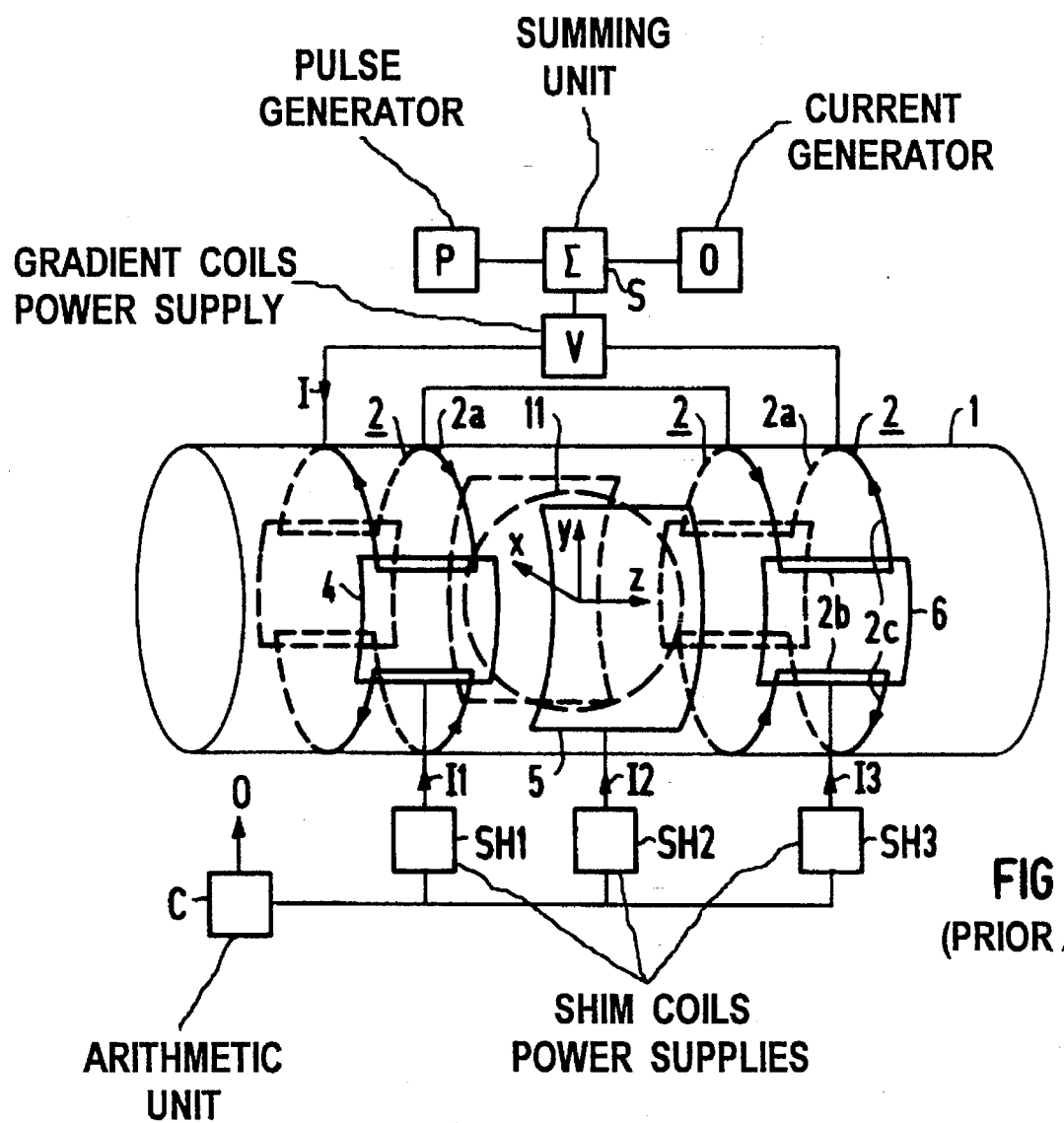
FIG. 1 is a schematic illustration of a known arrangement of shim channels in a nuclear magnetic resonance tomography apparatus.
Figure 2:
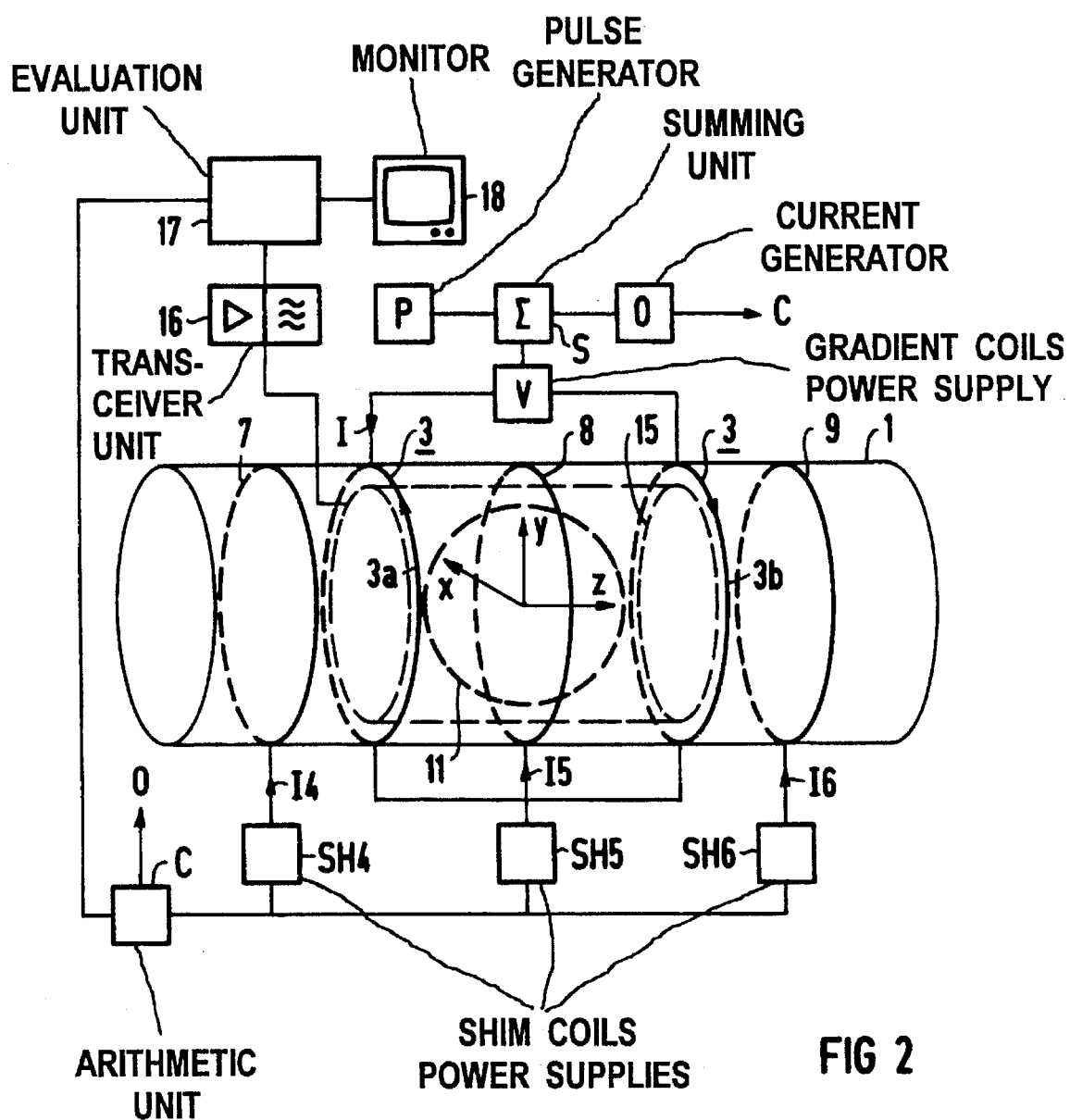
FIG. 2 is a schematic illustration showing a known arrangement of further shim channels in nuclear magnetic resonance tomography apparatus, and including a computer which operates the tomography apparatus in accordance with the principles of the present invention.

For spatial resolution in three dimensions, magnetic field gradients must be generated in three directions, preferably lying at right angles to one another. In FIGS. 1 and 2, a Cartesian coordinate system x, y, z is shown that represents the direction of the respective gradients. FIG. 1 schematically represents a conventional arrangement of gradient coils for the generation of a magnetic field gradient $G_y$ in the y-direction. The gradient coils 2 are constructed as saddle coils attached to a carrier tube 1. By means of the conductor sections 2a, a substantially constant magnetic field gradient $G_y$ is generated in the y-direction inside a spherically-shaped examination volume 11. Due to their larger distance from the examination volume 11, the return conductors generate only negligible components therein. The gradient coils for the magnetic field gradient $G_x$ are of identical construction to the gradient coils 2 for the magnetic field gradient $G_y$, only rotated 90° in the azimuthal direction on the carrier tube 1. For reasons of clarity, they are thus not shown in FIG. 1.

In FIG. 1, shim coils 4 to 6 are further shown, also constructed as saddle coils. Shim coils 4 to 6 are indicated only schematically. Details about the design of shim coils can be found e.g. in U.S. Pat. No. 3,569,823. Power supplies SH1 to SH3 are respectively allocated to the shim coils 4 to 6, charging the respective shim coils 4 to 6 with currents I1 to 13. The currents I1 to 13 are controllable via an arithmetic unit C.

The gradient coils 3 for the magnetic field gradients in the z-direction are schematically shown in FIG. 2. The coils are annularly constructed and are arranged symmetrically around the midpoint of the examination volume 11. Since current flows through the two individual coils 3a and 3b in opposite directions as represented in FIG. 2, they cause a magnetic field gradient $G_z$ in the z-direction. FIG. 2 further shows, again only schematically, additional shim coils 7 to 9, annular in this case, which are supplied with currents 14 to 16 by power supplies SH4 to SH6. Currents 14 to 16 are also controllable by the arithmetic unit C.

In FIGS. 1 and 2 the power supply V for the gradient coils 2 and 3 is further schematically represented. The current I through the respective gradient coils 2 and 3 is determined by a pulse generator P that predefines a measurement sequence and by a current sensor O. The output signals of the pulse generator P and the current sensor O for the activation of offset currents are added. The current sensor O is likewise controlled by the arithmetic unit C.

In FIG. 2, the elements for signal reception are further schematically represented (which are omitted from FIG. 1 for clarity). With an antenna 15, radio-frequency signals are applied to an examination subject and nuclear magnetic resonance signals are received from the subject. In a transceiver unit 16, the transmission signals are generated and the received nuclear magnetic resonance signals are demodulated in a phase-dependent manner. The demodulated nuclear magnetic resonance signals are evaluated in an evaluation circuit 17, for image information that is displayed on a monitor 18, as well as for information about the required shimming, which is converted into shim currents in the arithmetic unit C.

Magnetic fields can be represented on the basis of spherical harmonic functions. The axial components $B_z$ of the magnetic field, which are exclusively of interest here, can be represented by:

$$B_z\left(\vec{r}\right) = \sum_{n=0}^{\infty} (r/R)^n \sum_{m=0}^{\infty} P(n,m)(\cos\Theta)\,[a(n,m)\cos(m\phi) + B(n,m)\sin(m\phi)]$$

Here r, $\Theta$ and $\phi$ are the spherical coordinates of the vector $\vec{r}$, R is the radius of the volume to be imaged, P(n,m) are the corresponding Legendre polynomials of degree n and order m, and A(n,m) and B(n,m) are the coefficients of the spherical harmonic functions. The coefficient A(0, 0) characterizes the homogeneous basic field; all other coefficients describe homegeneity deviations. As is explained in U.S. Pat. No. 3,569,823 (cited above), shim coils can be designed so as to influence essentially only one of these coefficients, and thus to compensate for the field disturbance that corresponds to these coefficients.

Of course, in practice only a limited number of shim coils can be provided, so that only a corresponding number of the aforementioned coefficients of the spherical harmonic functions can be set to zero. In nuclear magnetic resonance tomography and in spectroscopy, in general it is possible to suffice even at high demand (precision) levels with nine non-linear shim coils, so that, together with the three gradient coils, twelve spherical coefficients that disturb the field distribution to the greatest extent can be brought to zero.

For shimming, it is first necessary to determine the existing field pattern. This can ensue e.g. by means of two gradient echo sequences according to FIGS. 3 to 8. After an excitation according to FIG. 3, the nuclear spins in the z-and x-directions are phase-encoded by means of phase coding gradients $G_z$ and $G_y$. In a first sequence, a gradient $G_x$ is further switched first in the negative direction and then in the positive direction. There thus arises at time $t_1$ a first gradient echo signal S1 on the basis of a re-phasing of the nuclear spins. Time $t_1$ is thereby given by the following condition:

$$\int_0^{t_1} G_x(t)\,dt = 0$$

Figure 14:
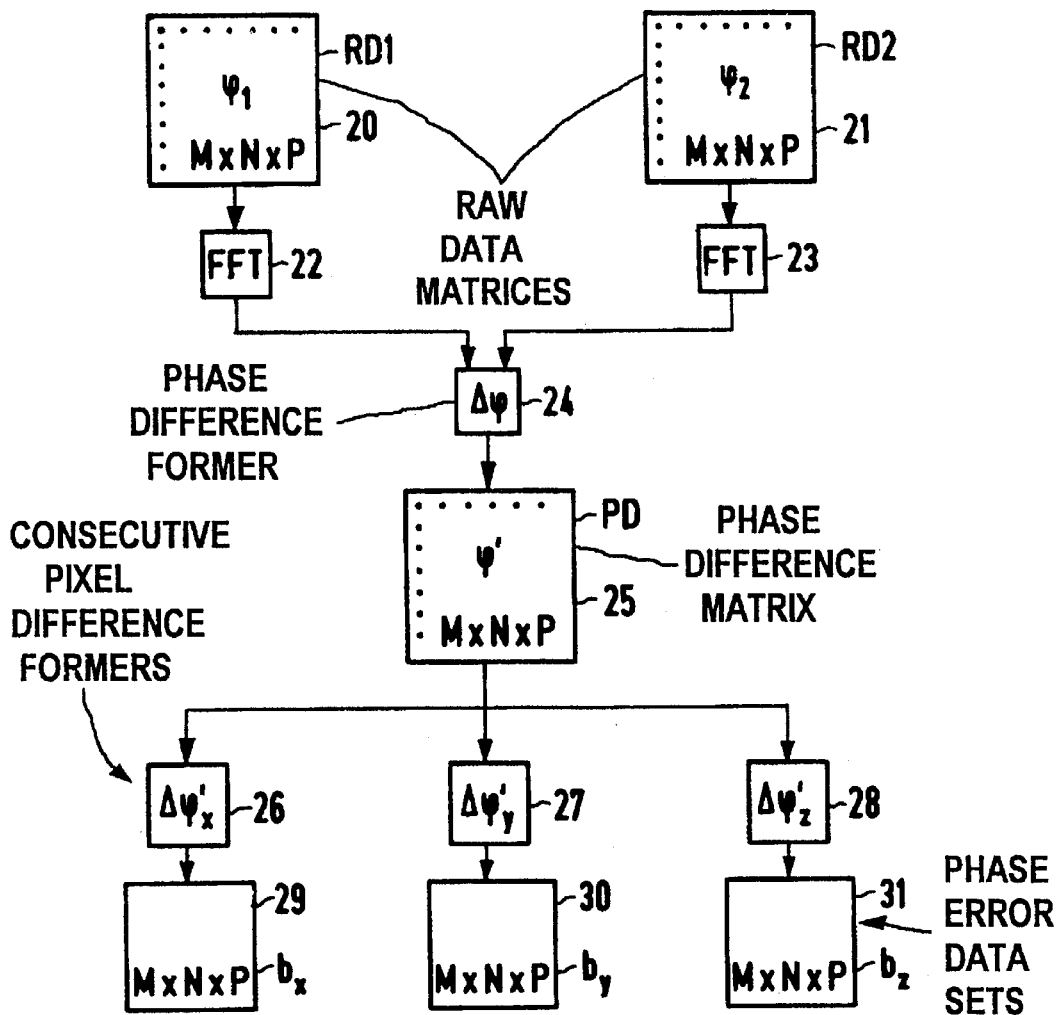
FIG. 14 illustrates the steps of the inventive method for determining phase error data sets.

The pulse sequence is repeated for M different values of the phase coding gradient $G_z$ and for N different values of the phase coding gradient $G_y$, so that N·M measurement values are finally obtained. All measurement values are sampled P times and digitized. The digitized values are entered into a three-dimensional matrix of a size M·N·P, sorted according to their phase factors. The phase of the nuclear magnetic resonance signals obtained in this way does not depend only on the switched gradients, but also represents field inhomogeneities. Since the measurement of the field depends only on the phase of the respective signals, it is sufficient to enter only the phase value for each sampled signal into a raw data matrix. A raw data matrix of this sort is schematically represented in FIG. 14, designated as RD1.

The same sequence order is again iterated, but this time signals S2 are obtained at a later echo time $t_2$. As is shown in FIG. 6, this is achieved by making the positive part of the gradient $G_x'$ smaller, so that the re-phasing condition is satisfied later. Otherwise all measurement parameters are identical to the preceding sequence. With the second sequence, a second raw data matrix RD2 is obtained. In this raw data matrix RD2, magnetic field inhomogeneities have a stronger effect on the phase $\phi_2$ since, due to the longer echo time $t_2$, magnetic field inhomogeneities remain in effect for a longer time.

For acquiring the magnetic field inhomogeneity, in general a significantly lower spatial resolution is required than for imaging. For example, in general it is possible to suffice with 32 pixels for each spatial direction, and thus with a raw data matrix RD1 or RD2 of a size 32×32×32.

For obtaining two signals S1 and S2 with different echo times, it is not necessarily the case that two pulse sequences must be used; rather, there are also pulse sequences that provide two signals with different echo times after a single excitation. As an example, in FIGS. 9 to 13 a pulse sequence is represented that is described in more detail in U.S. Pat. No. 4,825,159. A so-called steady-state sequence is used, i.e., the repetition time of the high-frequency pulse RF according to FIG. 9 is shorter than the relaxation times T1 and T2. As in the usual gradient echo sequence with three-dimensional spatial coding, after the excitation two phase coding gradients $G_z$ and $G_y$, as well as a negative gradient $G_{x1}$ for de-phasing the spins, are activated. A positive gradient $G_{x2}$ is subsequently activated, as a result of which the spins re-phase and supply a first echo signal S1 with a first echo time $t_1$. Before the application of the next high-frequency pulse RF, in this case another positive gradient $G_{x3}$ is activated in the x-direction, so that a second signal S2 with an echo time $t_2$ arises. Finally, after the first high-frequency pulse $RF_n$, all the gradients are reset before the next high-frequency pulse $RF_{n+1}$ is applied.

On the basis of the specified sequences, two raw data matrices RD1 and RD2 are thus obtained, in which the respective phases $\phi_1$ or $\phi_2$ of magnetic nuclear resonance signals are entered in k-space with three-dimensional resolution, which due to the different echo times have different dependencies on magnetic field inhomogeneities, as schematically shown in FIG. 14.

In the next step, the two raw data matrices RD1 and RD2 are subjected to a three-dimensional Fourier transformation (FFT, Fast Fourier Transformation) in FFT units 22 and 23, and a phase difference is formed in phase difference former 24 from the Fourier-transformed raw data sets. This phase difference can be obtained, for example, by complex conjugate multiplication of the raw data matrices. Since the raw data sets (RD1, RD2) are distinguished only by the echo times of the obtained nuclear magnetic resonance signals, on the basis of this difference a phase difference matrix PD having M·N·P pixels is obtained, to which a phase $\phi'$, still dependent only on the magnetic field inhomogeneity, is allocated. Up to this point, the specified method is known. In contrast to the prior art, however, the phase difference matrix is not used directly, but rather the phase differences of two consecutive pixels are determined. As schematically indicated in FIG. 14, this takes place in three spatial directions x, y and z in three consecutive pixel difference formers 26, 27 and 28. Three phase error data sets $b_x$, $b_y$ and $b_z$ are thereby obtained, and are respectively stored in matrices 29, 30 and 31, each having M·N·P pixels.

Figure 15:
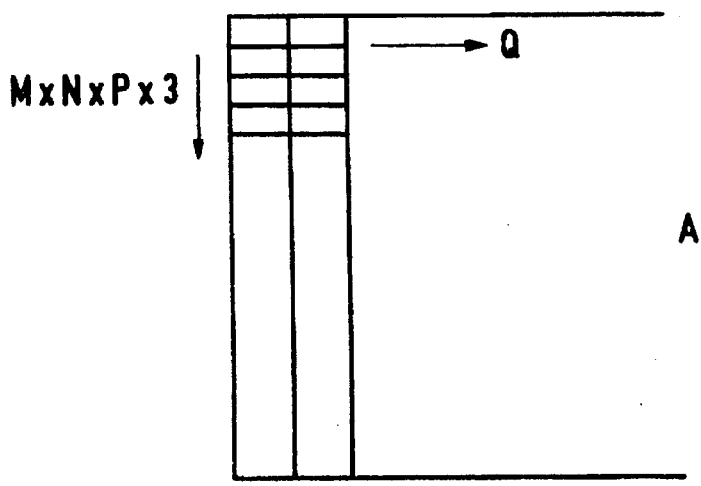
FIG. 15 schematically illustrates the construction of a matrix A used in the inventive method.

In order to obtain setting values for the individual shim channels on the basis of this matrix, it must be determined what influence a given current has on the phase differences in each channel, as these differences are given in the phase error data sets $b_x$, $b_y$ and $b_z$. Before the actual measurement, reference measurements must therefore be made, whereby the phase error data sets are determined once with and once without an activated shim current. On the basis of a difference formation, it can then be determined for each shim channel what influence the given current has on the phase error data sets $b_x$, $b_y$ and $b_z$. This influence is represented in the form of a matrix A, indicated schematically in FIG. 15. This matrix A is e.g. constructed so that each column corresponds to a shim channel; for Q shim channels there are thus Q columns. In each line there is a coefficient that gives the influence of the respective shim channel on a pixel in the phase error data sets $b_x$, $b_y$ and $b_z$. Since each of these phase error data sets comprises M·N·P pixels, the matrix A must thus have a total of 3·M·N·P·Q values.

This matrix A has to be determined only once for each apparatus, and then remains constant as long as no alterations are made to the apparatus.

In order to determine the shim currents in the individual shim channels, after the determination of the phase error data sets $b_x$, $b_y$ and $b_z$ the following system of equations must be solved:

$$A \cdot \vec{I} = \vec{b}$$

$\vec{I}$ thereby represents the vector of the desired shim current. $\vec{b}$ is a phase vector containing all the phase differences from the measured phase error data sets $b_x$, $b_y$ and $b_z$. The phase vector $\vec{b}$ thus has a length of 3·M·N·P in the exemplary embodiment.

The system of equations mentioned above can also be determined e.g. according to the standard method of the least squares, i.e., through the formation of the minimum of the quadratic deviations $A \cdot \vec{I} - \vec{b}$. The vector of the desired shim current is thus.

$$\min \| A \vec{I} - \vec{b} \|2$$

In many applications, shimming is not carried out over the entire object of examination, but rather over a partial area only, e.g. a selected layer. In this case, the evaluation method can be shortened by processing not the entire Fourier-transformed three-dimensional data set, but only the pixels of this data set that are to be allocated to the partial area to be shimmed. A correspondingly smaller volume of data is thereby processed.

The disclosed method succeeds in shimming a magnet system without placing high demands on the initial homogeneity before the beginning of the shimming procedure due to the signals from fat-bound protons.

The disturbing influence of fat-bound protons can also be eliminated by fixing the difference of the echo times $\Delta t_e = t_2 - t_1$ in the formation of the two raw data sets RD1 and RD2 so that the signals from fat-bound and from water-bound protons coincide in phase. For a basic magnetic field of 1.5 T, this would e.g. be achieved at a difference in the echo times of 4.7 ms.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for shimming a magnet system of a nuclear magnetic resonance tomography apparatus having at least one shim channel, comprising the steps of:
   producing a predefined matrix indicating, for each channel, an effect of a unit current in that shim channel on each pixel of a phase error data set;
   obtaining first and second nuclear magnetic resonance raw data sets each containing phase information with the respective phase information in the first and second raw data sets being differently dependent on magnetic field inhomogeneities, said first and second raw data sets being compiled in the form of first and second three-dimensional raw data matrices;
   three-dimensionally Fourier transforming said first and second raw data matrices to obtain first and second Fourier-transformed matrices each containing pixels;
   identifying phase differences between corresponding pixels of said Fourier-transformed matrices and producing a three-dimensional phase-difference matrix embodying said phase differences;
   determining phase differences between consecutive pixels of said phase difference matrix in at least one spatial direction and forming one phase error data set per spatial direction;
   determining a shim current for said at least one shim channel from said phase error data sets and said predefined matrix; and
   supplying said shim current to said at least one shim channel.

2. A method as claimed in claim 1 wherein the step of determining phase differences between consecutive pixels of said phase difference matrix in at least one spatial direction comprises determining phase differences between consecutive pixels of said phase difference matrix in three orthogonal spatial directions.

3. A method as claimed in claim 1 wherein the step of determining phase differences between corresponding pixels of said first and second Fourier-transformed raw data matrices comprises complex conjugate multiplication of said Fourier-transformed raw data matrices.

4. A method as claimed in claim I wherein the step of determining said shim current comprises minimizing quadratic deviations of a quantity $A\cdot\vec{i}-\vec{b}$, wherein A is said predefined matrix, and wherein said shim current and said phase error data sets are in the form of vectors $(\vec{i},\vec{b})$.

5. A method as claimed in claim 1 comprising the additional step of utilizing a selected portion of said first and second Fourier-transformed matrices representing a selected area to be shimmed.

6. A method as claimed in claim 1 wherein the step of obtaining said first and second nuclear magnetic resonance raw data sets comprises conducting two gradient echo sequences with respectively different echo times.

7. A method as claimed in claim 1 comprising the step of selecting a difference between said echo times for causing gradient echoes from fat and water nuclear magnetic resonance signals to coincide in phase.

8. A method as claimed in claim 1 wherein the step of obtaining said first and second nuclear magnetic resonance raw data sets comprises using a single pulse sequence in which two gradient echo signals with respectively different echo times arise.

9. A method as claimed in claim 8 comprising the step of selecting a difference between said echo times for causing gradient echoes from fat and water nuclear magnetic resonance signals to coincide in phase.

10. An apparatus method for shimming a magnet system of a nuclear magnetic resonance comprising:
    at least one shim channel;
    means for producing a predefined matrix indicating, for each channel, an effect of a unit current in that shim channel on each pixel of a phase error data set;
    RF and gradient coil obtaining means for first and second nuclear magnetic resonance raw data sets each containing phase information with the respective phase information in the first and second raw data sets being differently dependent on magnetic field inhomogeneities;
    means for phase-dependently demodulating said first and second raw data sets to obtain first and second demodulated data sets and for respectively compiling said first and second demodulated data sets in the form of first and second three-dimensional raw data matrices;
    means for three-dimensionally Fourier transforming said first and second raw data matrices to obtain first and second Fourier-transformed matrices each containing pixels;
    means for identifying phase differences between corresponding pixels of said Fourier-transformed matrices and producing a three-dimensional phase-difference matrix embodying said phase differences;
    means for determining phase differences between consecutive pixels of said phase difference matrix in at least one spatial direction and forming one phase error data set per spatial direction; and
    means for determining a shim current for said at least one shim channel from said phase error data sets and said predefined matrix and for supplying said shim current to said at least one shim channel.

11. An apparatus as claimed in claim 10 wherein said means for determining phase differences between consecutive pixels of said phase difference matrix in at least one spatial direction comprise means for determining phase differences between consecutive pixels of said phase difference matrix in three orthogonal spatial directions.

12. An apparatus as claimed in claim 10 wherein said means determining phase differences between corresponding pixels of said first and second Fourier-transformed raw data matrices comprise means for complex conjugate multiplication of said Fourier-transformed raw data matrices.

13. An apparatus as claimed in claim 10 wherein said means for determining said shim current comprise means for minimizing quadratic deviations of a quantity $A\cdot\vec{i}-\vec{b}$, wherein A is said predefined matrix, and wherein said shim current and said phase error data sets are in the form of vectors $(\vec{i},\vec{b})$.

14. An apparatus as claimed in claim 10 further comprising means for utilizing a selected portion of said first and second Fourier-transformed matrices representing a selected area to be shimmed.

15. An apparatus as claimed in claim 10 wherein said RF and gradient coil means comprise RF and gradient coil means for conducting two gradient echo sequences with respectively different echo times.

16. An apparatus as claimed in claim 10 wherein said RF and gradient coil means comprise RF and gradient coil means for conducting two gradient echo sequences with respectively different echo times having a difference therebetween for causing gradient echoes from fat and water nuclear magnetic resonance signals to coincide in phase.

17. An apparatus as claimed in claim 10 wherein said RF and gradient coil means comprise RF and gradient coil means for conducting a single pulse sequence in which two gradient echo signals with respectively different echo times arise.

18. An apparatus as claimed in claim 10 wherein said RF and gradient coil means comprise RF and gradient coil means for conducting a single pulse sequence in which two gradient echo signals with respectively different echo times arise having a difference therebetween for causing gradient echoes from fat and water nuclear magnetic resonance signals to coincide in phase.

* * * * *